(12) United States Patent
Maslekar et al.

(10) Patent No.: US 10,430,731 B2
(45) Date of Patent: Oct. 1, 2019

(54) METHOD FOR PROVIDING CONFIGURATION INFORMATION FOR A SYSTEM COMPRISING A PLURALITY OF MOVING OBJECTS

(71) Applicant: NEC Europe Ltd., Heidelberg (DE)

(72) Inventors: Nitin Maslekar, Heidelberg (DE); Konstantinos Gkiotsalitis, Frankfurt am Main (DE)

(73) Assignee: NEC CORPORATION, Tokyo (JP)

( * ) Notice: Subject to any disclaimer, the term of this patent is extended or adjusted under 35 U.S.C. 154(b) by 73 days.

(21) Appl. No.: 15/561,986

(22) PCT Filed: Mar. 31, 2015

(86) PCT No.: PCT/EP2015/056992
§ 371 (c)(1),
(2) Date: Sep. 27, 2017

(87) PCT Pub. No.: WO2016/155790
PCT Pub. Date: Oct. 6, 2016

(65) Prior Publication Data
US 2018/0068238 A1   Mar. 8, 2018

(51) Int. Cl.
*G06Q 10/04* (2012.01)
*G06Q 10/06* (2012.01)
*G06Q 50/30* (2012.01)
*H03H 21/00* (2006.01)

(52) U.S. Cl.
CPC .......... *G06Q 10/047* (2013.01); *G06Q 10/04* (2013.01); *G06Q 10/06* (2013.01); *G06Q 10/0631* (2013.01); *G06Q 50/30* (2013.01); *H03H 21/0012* (2013.01); *H03H 2021/0087* (2013.01)

(58) Field of Classification Search
CPC .... G06Q 10/04; G06Q 10/06; G06Q 10/0631; G06Q 50/30; H03H 21/0012
USPC ........................................................ 701/423
See application file for complete search history.

(56) References Cited

FOREIGN PATENT DOCUMENTS

| CN | 102737356 A | 10/2012 |
|---|---|---|
| CN | 103440422 A | 12/2013 |
| EP | 2772894 A1 | 9/2014 |
| GB | 2517635 A | 2/2015 |

*Primary Examiner* — Maceeh Anwari
(74) *Attorney, Agent, or Firm* — Leydig, Voit & Mayer, Ltd.

(57) ABSTRACT

A method for providing configuration information for a system having a plurality of vehicles includes assigning, for each vehicle, a first number of degrees of freedom (DOF); presetting one or more system parameters representing a performance of at least part of the system (SP); successively optimizing each respective vehicle at each station by selecting a DOF for each vehicle from a second number of DOF for the respective vehicle and computing a global SP; assigning each vehicle of each station a DOF resulting from a first system configuration (SC); evaluating the global SP for the first SC; identifying one or more stations having a negative impact (NIS) on the global SP on the first SC; and successively optimizing, for the one or more NIS, each vehicle locally at each respective NIS with regard to the SP with a number of DOF greater than said second number of DOF.

11 Claims, 10 Drawing Sheets

METHOD FOR PROVIDING CONFIGURATION INFORMATION FOR A SYSTEM COMPRISING A PLURALITY OF MOVING OBJECTS

CROSS REFERENCE TO RELATED APPLICATIONS

This application is a U.S. National Stage Application under 35 U.S.C. § 371 of International Application No. PCT/EP2015/056992 filed on Mar. 31, 2015. The International Application was published in English on Oct. 6, 2016 as WO 2016/155790 A1 under PCT Article 21(2).

FIELD

The present invention relates to a method for providing configuration information for a system comprising a plurality of moving objects, preferably vehicles, each moving in time and each passing one or more stations successively The present invention further relates to a computing entity for providing configuration information for a system comprising a plurality of moving objects, preferably vehicles, each moving in time and each passing one or more stations successively.

BACKGROUND

Public transport systems in particular operations of buses, are considered as a complex system having dependencies, for example headways among busses and a number of entities, i.e. said busses that evolve over time. An enforcement of a policy, i.e. an increase or decrease of the dwell time of a bus at one bus station, which may be also termed degree of freedom, 'DOF', has unknown effects to the system in general due to the dependencies among the busses. These effects can for example be estimated by a simplistic model or by simulations of more complicated models considering also more detailed parameters like weather conditions, traffic, etc. In both cases, i.e. estimating the effect by a simplistic model or performed complex simulations of complicated models, every time that a measure is applied to the busses, i.e. an increase of the dwell time of a bus at one bus stop, a computation with computational cost C is required for estimation of this effect to the overall system.

The fleet of busses may have certain so-called degrees of freedom, 'DOF', wherein the number of said DOF is denoted with $N_f$. In other words $N_f$ represents a set of policies that can be applied by an operator, for example either increase or decrease the dwell time of a bus by 1, 2, 3, 4 or more minutes at a bus station in order to achieve a global optimization on the bus system. For example since excess dwell times like ten minutes or above are usually be impractical for the bus operator and annoying to waiting passengers, other measures such as speed control, like enforcement of a reduction of an average speed of a bus between two stations, can be applied to compensate for possible limitations on the time that a bus can wait at a station.

The dwell time can also be negative if the average speed of the bus is increased after corresponding information from the bus operator. Thus, the bus operator has increased capabilities when the number of degrees of freedom $N_f$ is higher. The bus operator is now faced with the problem of optimizing bus scheduling among all busses using measures that optimize globally the performance of the bus operation.

One possibility is a brute-force computation of the influence of each degree of freedom to the bus system leading to the following number of computations with base computational cost $C:N_f^{NE+NS}$, where $N_S$ is the number of stations, $N_E$ the number of buses and $N_f$ the degree of freedom measures available to the bus operator. The computational cost of calculating a global optimum of the system grows exponentially with the number of buses and stations, hence the system has the problem that it fails to scale up in its early phase already as it is shown in FIG. 1.

In the non-patent literature of SUN Chuanjiao, ZHOU Wei, WANG Yuanqing, 2008, "Scheduling Combination and Headway Optimization of Bus Rapid Transit", JOURNAL OF TRANSPORTATION SYSTEMS ENGINEERING AND INFORMATION TECHNOLOGY, Volume 8, Issue 5, October 2008 as well as in CN 102737356A or CN 103440422A conventional methods and systems for bus scheduling are shown.

For example CN 103440422A discloses a bus behind-schedule recovering method based on arrival time prediction with a time window. The method comprising the steps of predicating arrival time of the bus by using Kalman filtering, taking a predication result as the basis, giving out a dispatching time/judging time window, providing the behind-schedule recovering concept introducing a time deviation coefficient as well as taking a corresponding speed of a critical time deviation coefficient and maximum allowable speed as restrictions to establish a behind-schedule recovering model, so as to provide a speed of road segment driving to a bus driver and a dispatching center to avoid possible behind-schedule or recover a novel operation as soon as possible.

SUMMARY

In an embodiment, the present invention provides a method for providing configuration information for a system comprising a plurality of vehicles, each vehicle moving in time and passing one or more stations in succession, the method to be performed in memory available to one or more processors. The method includes assigning, for each vehicle, a first number of degrees of freedom (DOF); presetting one or more system parameters representing a performance of at least part of the system (SP); successively optimizing each respective vehicle at each station by selecting a DOF for each vehicle from a second number of DOF for the respective vehicle, wherein the second number of DOF is smaller than the first number of DOF, and computing a global SP; assigning each vehicle of each station a DOF resulting from a first system configuration (SC); evaluating the global SP for the first SC; identifying one or more stations having a negative impact (NIS) on the global SP on the first SC; and successively optimizing, for the one or more NIS, each vehicle locally at each respective NIS with regard to the SP with a number of DOF greater than said second number of DOF and such that the SP for the first SC does not deteriorate.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
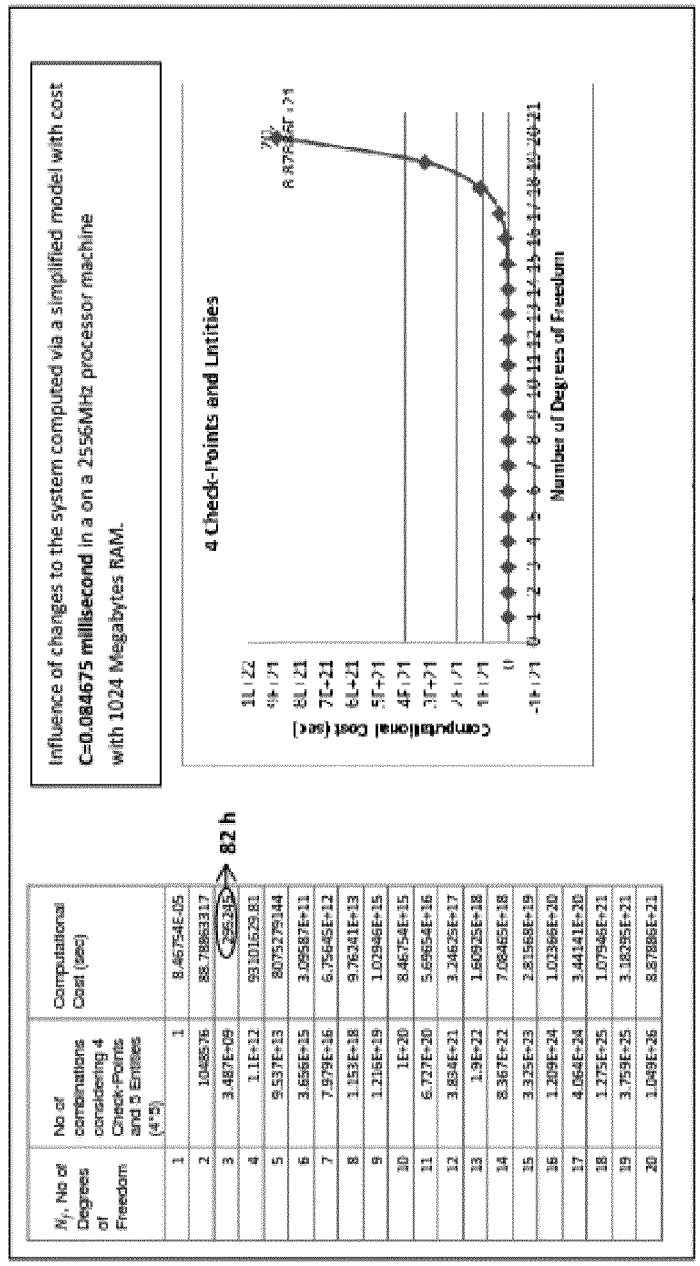
FIG. 1 shows a test of a simplified use case of a conventional method.

One of the problems of conventional methods and systems is that they cannot optimize the departure time schedule and dwell times of busses in real-world problems within a reasonable time frame even in trivial cases. Therefore a required set of actions cannot be suggested to bus drivers. A further problem is that the conventional methods and systems are limited to certain models or simulation procedures.

Embodiments of the present invention increase the flexibility in terms of system implementation. Embodiments of the present invention also reduce computational resources to an affordable level for real-time problems.

According to an embodiment of the invention, a method is provided for providing configuration information for a system comprising a plurality of moving objects, preferably vehicles, each moving in time and each passing one or more stations successively, wherein for each moving object a first number of degrees of freedom, 'DOF' are assigned and wherein one or more system parameters are preset representing a performance of at least part of said system, system performance 'SP', the method is performed in a memory available to a computing entity, a computer, a cloud or the like, the method includes:
A) successively optimizing each moving object at each station by
selecting a DOF for each moving object out of a second number of DOF for said moving object, wherein the second number of DOF is smaller than the first number of DOF and
computing a global SP
resulting a first system configuration, 'SC', assigning each moving object of each station a DOF,
B) evaluating said global SP for said first SC,
C) identifying stations having a negative impact, 'NIS', on the global SP on said first SC,
D) for said NIS successively optimizing each moving object locally at each NIS with regard to said SP with a number of DOF greater than second number of DOF and such that the SP for the first SC does not deteriorate.

An embodiment of the invention provides a computing entity for providing configuration information for a system comprising a plurality of moving objects, preferably vehicles, each moving in time and each passing one or more stations successively, wherein for each moving object a first number of degrees of freedom, 'DOF' are assigned and wherein one or more system parameters are preset representing a performance of at least part of said system, system performance 'SP', said computing entity is adapted to:
A) successively optimize each moving object at each station by
selecting a DOF for each moving object out of a second number of DOF for said moving object, wherein the second number of DOF is smaller than the first number of DOF and
computing a global SP
resulting a first system configuration, 'SC', assigning each moving object of each station a DOF,
B) evaluate said global SP for said first SC,
C) identify stations having a negative impact, 'NIS', on the global SP on said first SC,
D) for said NIS successively optimize each moving object locally at each NIS with regard to said SP with a number of DOF greater than said second number of DOF and such that the SP for the first SC does not deteriorate.

Although applicable in general to any kind of system the present invention will be described with regard to a public transport system, in particular in form of a bus transport system.

Although applicable to any kind of moving object in general, the present invention will be described with regard to moving objects in form of busses.

The term "global" in connection with evaluation and/or optimization can be understood as evaluation and/or optimization of the whole system.

The term "local" in connection with evaluation and/or optimization can be understood as evaluation and/or optimization of part of the system. A part of a system can be, e.g., a station, a plurality of stations, a plurality of moving objects at a station or the like.

The term degree of freedom or DOF can be understood as or can represent a policy or a set of policies that can be applied e.g. by an operator to the moving object. For example a degree of freedom may be either an increase or decrease of a dwell time of a bus by 1, 2, 3, 4 or more minutes at a bus station in order to achieve a global optimization on a bus system.

Embodiments of the invention can provide a computational reduction for providing configuration information of a system comprising a plurality of moving objects to an affordable level.

Embodiments of the invention can provide an increase in flexibility on estimation methods for capturing an effect of an implementation of degrees of freedom to an underlying system.

With regard to a bus system, embodiments of the invention can speed up a computation with a headway optimization technique, for example implemented within a computation device helping computing the results for the bus system in near-real time and thus making feasible the dispatching of information to bus drivers. Bus drivers can then be informed prior to their departure or during the operation of the bus with the use of network infrastructure and a purpose-built interface for adapting to the changes. Embodiments of the present invention can enable the generation of new bus schedules including dwell times at each station for each moving object and can enable the optimization of operations of moving vehicles by improving a headway deviation within a reasonable time frame.

According to a preferred embodiment a second number of DOF is selected out of a first number of DOF by a stochastic annealing search. A stochastic annealing search increases the efficiency when selecting an appropriate DOF for optimizing the system performance SP.

According to a further preferred embodiment for identifying NIS, the local SP of each station is computed and compared with a predefined threshold. This enables in an efficient way to determine the "bad" performing stations with regard to the system performance.

According to a further preferred embodiment for D) said moving objects are optimized sequentially. This enables a fast execution of D).

According to a further preferred embodiment said sequential optimization is performed in reverse arrival order of said moving objects at each NIS. This even further increases the efficiency when selecting the most promising DOF for each moving object to increase the system performance.

According to a further preferred embodiment at each NIS the local SP for said NIS is evaluated and if said local SP evaluation provides a deteriorated global SP then for the same NIS the selected DOF is eliminated from the set of DOF to be selected and D) is performed again for said NIS. This allows in a very efficient way to select the most appropriate DOF for each moving object at each station.

According to a further preferred embodiment the local SP is evaluated together with a global SP at an NIS sequentially for each moving object and if said successive evaluation performed for each moving object reveals that said global SP and said local SP are enhanced then at said NIS the next moving object is optimized by choosing a DOF until a moving object is found further enhancing said local SP and said global SP. This enables in an alternative way to optimize the global SP at each NIS.

According to a further preferred embodiment for D) a penalty score is computed and evaluated representing the difference between said predefined threshold and said global SP divided by the number of NIS. This penalty score provides a distribution of the system performance violation among the stations without penalizing the already computed "global direction" for the system performance. This enables for example an easier evaluation of the violation of the system performance by the NIS, i.e. the bad performing stations.

According to a further preferred embodiment during said stochastic annealing search successively probabilities for selecting a DOF are redefined based on already computed global SP, preferably of the global SP based on preset data, of the global SP based on optimization on preset data without a DOF of each moving object and if applicable the prior computed probability for said DOF. This enhances the efficiency and probability for selecting the DOF most promising for enhancing the system performance. Preset data can be represented by historical data of the spatio-time evolution of the system in the past.

According to a further preferred embodiment a global optimized configuration is obtained based on a result of steps A)-D) and wherein said global configuration is evaluated and provided in parts as operating information to each moving object correspondingly and/or to each station correspondingly. This allows to distribute the optimized system configuration to each moving object to be performed by this moving object and also to the corresponding stations, so as to inform for example in case of busses the passengers or to provide further information for arriving busses at said stations.

FIG. 1 shows a test of a simplified use case of a conventional method. In FIG. 1 a test of a scalability of an optimization of a system in a simplified use case is shown. The computational cost exponentially increases with the number of degrees of freedom leading to an impractical real-world use of conventional methods and systems.

Figure 2:
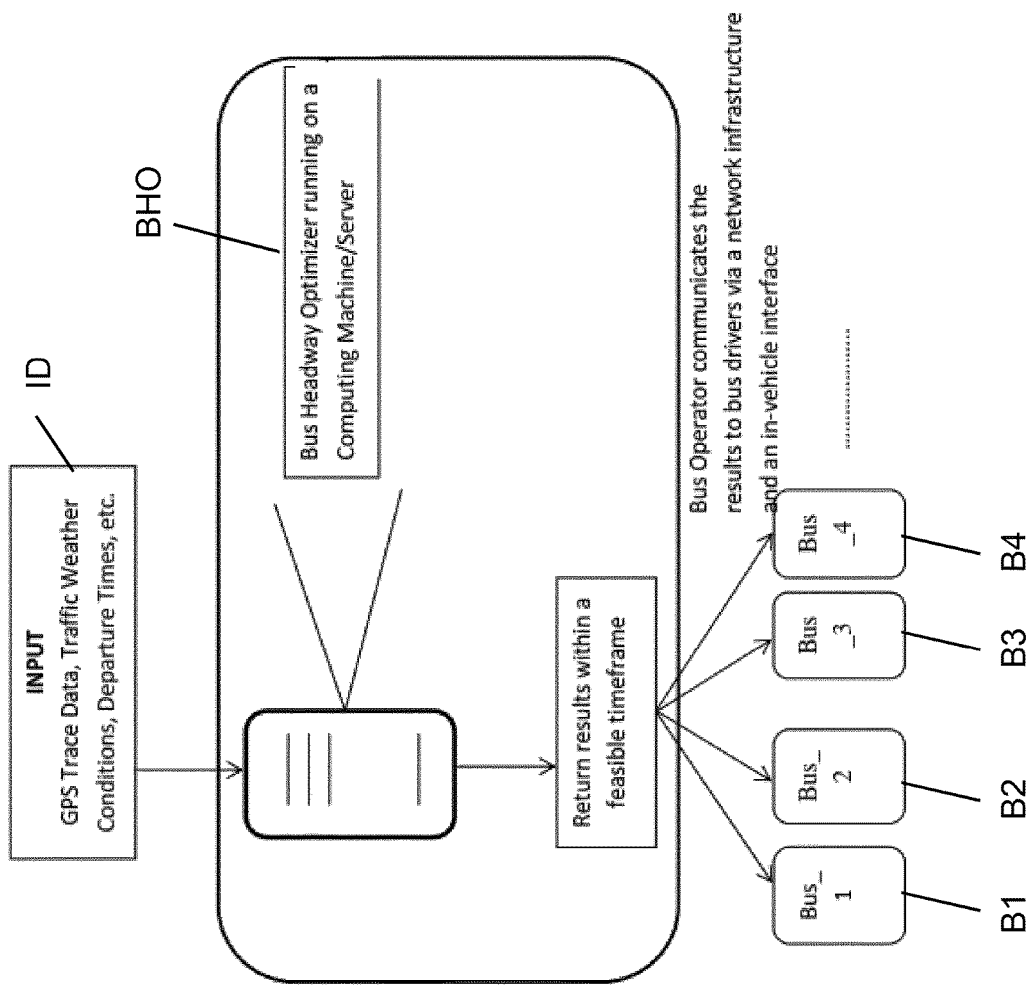
FIG. 2 shows steps of a method according to an embodiment of the present invention.

FIG. 2 shows steps of a method according to a first embodiment of the present invention. In FIG. 2 input data ID like GPS trace data, traffic conditions, weather conditions, departure times, etc. are input into a bus headway optimizer BHO running on a computing machine, server, cloud or the like. The output of the bus headway optimizer BHO are results for operating the busses with optimized headway information obtained within a feasible time frame. The bus operator communicates then these results to the bus drivers of the busses B1, B2, B3, B4 for example via an infrastructure. The results are then presented via an in-vehicle interface to the drivers or are automatically enforced in the corresponding busses B1, B2, B3, B4, for example by limiting the maximum speed of the bus or the like.

Figure 3:
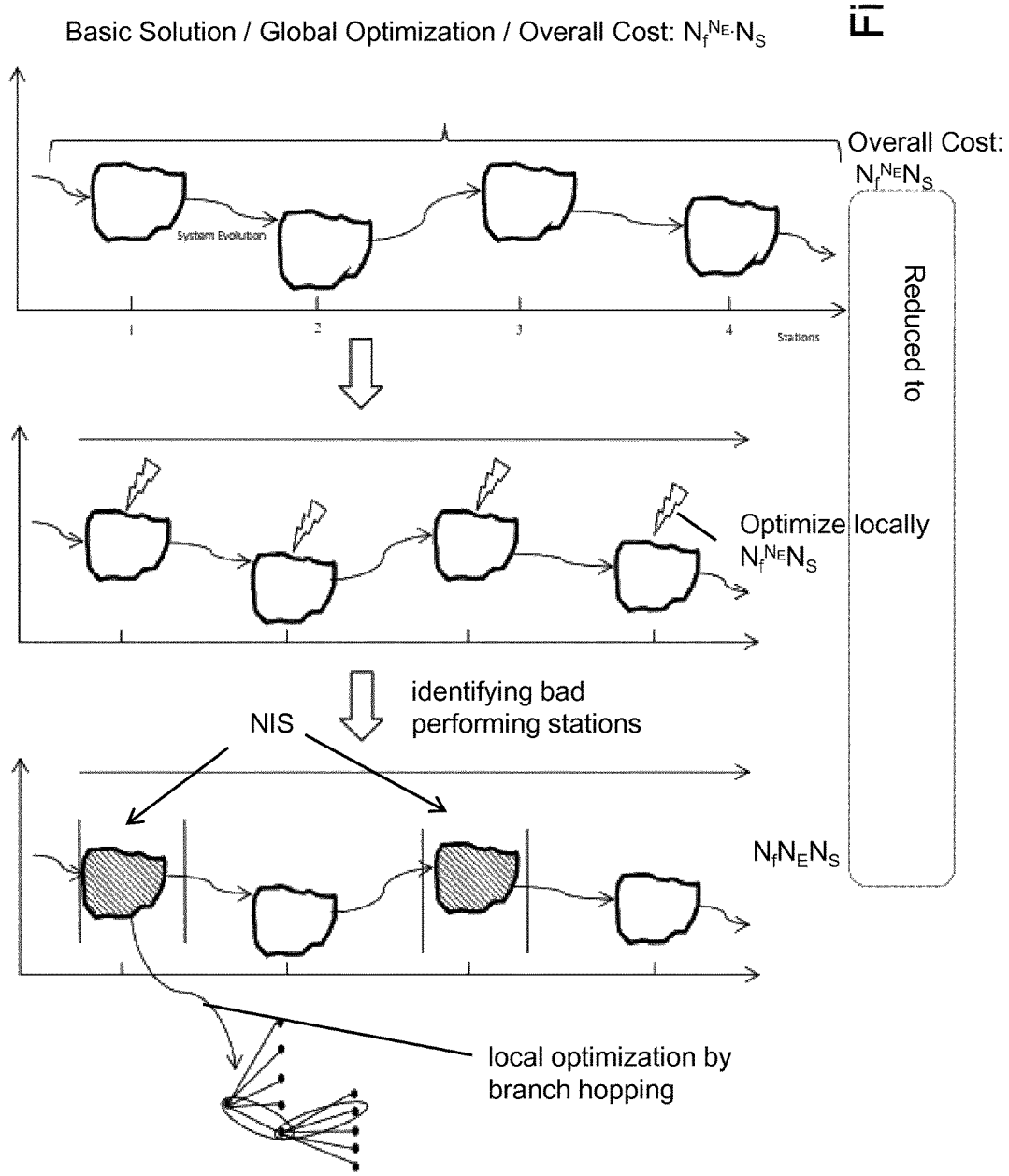
FIG. 3 shows steps of a method according to an embodiment of the present invention.

FIG. 3 shows a part of steps of a method according to a second embodiment of the present invention. In FIG. 3 steps for obtaining a sub-optimal solution with an affordable computational cost according to an embodiment of the present invention are shown. From top to down a "direction towards a global optimum" of the system is obtained via successive local optimizations instead of searching for the global optimum of the system itself. This consequently reduces the computational costs. The degrees of freedom are also reduced for limiting the solution space for optimization via a stochastic annealing search. A global optimization direction is then returned within a reasonable computational time frame. In the last sketch below the bad-performing stations NIS are isolated and each bad-performing station is optimized via a stochastic branch hopping by increasing the degrees of freedom and broadening the search on the solution space without penalizing the previously computed global-optimization direction solution. This enables a scaling up in an improved way and returns a system configuration optimizing the moving object operation in a balanced way within a reasonable time frame ($N_f^{NE} \cdot N_S + N_f \cdot N_E \cdot N_S$).

Figure 4:
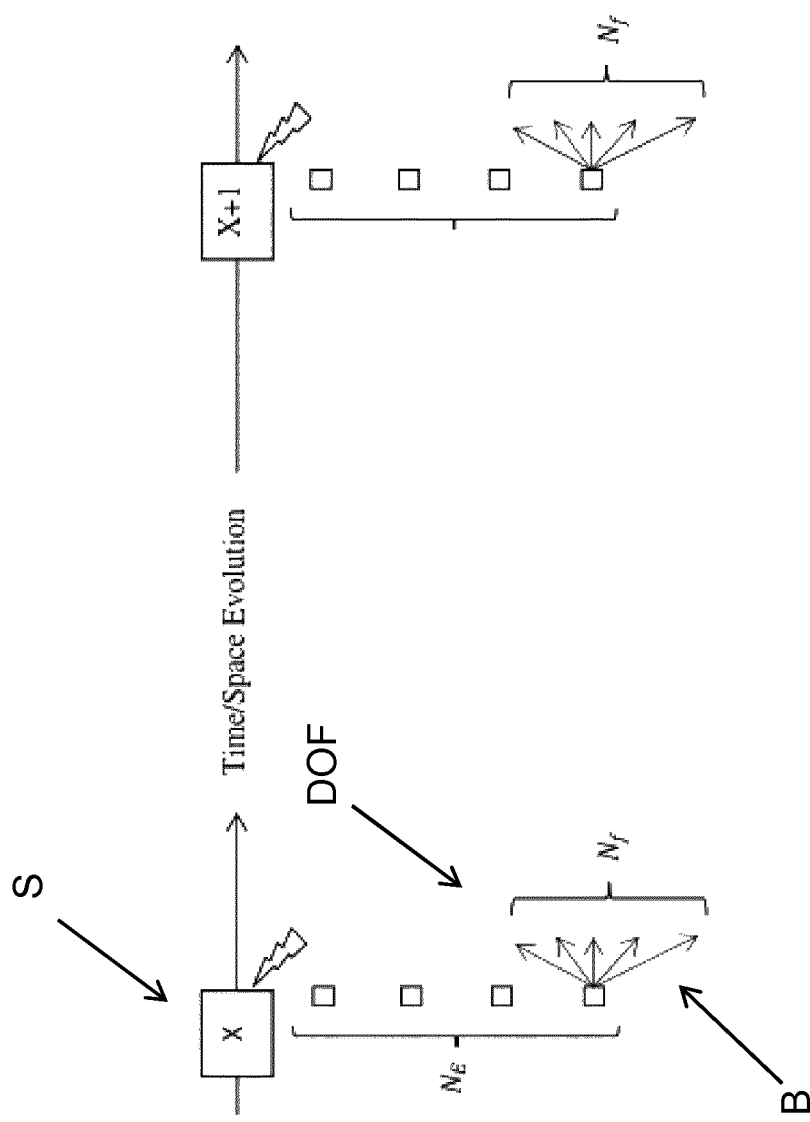
FIG. 4 shows a part of a system according to an embodiment of the present invention.

FIG. 4 shows schematically part of a system according to a third embodiment of the present invention. In FIG. 4 a spatio-temporal evolving system comprising a plurality of busses and a plurality of stations is split into segments comprising one station each. In a first step the spatio-temporal evolving bus system is split into segments comprising one bus station S each. When starting from the first bus station S and following a successive order, the local set of policies, i.e. the DOF are computed for selecting the one that optimized the bus operation until the examined station X. Then, the computed solution is adopted to the system and taken into account when optimizing the current state of the system at the preceding station X–1. For instance, when looking at station X all computed policies for optimizing previous stations X–1, X–2, . . . are considered before starting the optimization procedure on station "X+1". Such approach reduces the required number of computations from $N_f^{NE*NS}$ to: $N_f^{NE}*N_S$. Nevertheless, the computational cost is still not-scalable if the number of degrees of freedom is in excess. In practice, in particular more than 3 degrees of freedom for the bus operator can hinder severely the problem computation.

In that stage, the degrees of freedom are reduced to $N'_f \leq 3$ and a constrained solution search is performed with cost $N'^{NE}_f \cdot N_S \cdot N'_f$ is a subset of $N_f$ and is defined to reduce the solution space while moving efficiently towards the direction of global optimum, a "stochastic annealing search" method is introduced. The efficiency of headway optimization is measured in terms of Excess Wait Time, 'EWT', at the bus stop. Excess wait time is the difference between actual wait time and schedule wait time for a specific time period.

The "stochastic annealing search" comprises of the following steps:

1. Compute the performance cost of the system, $EWT_{global}$, and $EWT_{DO-NOTHING}$, if no policies are applied, i.e. no degrees of freedom are considered.

2. Initial search—For one entity, i.e. bus at one checkpoint of the system, i.e. a station find the policy measure from the available set of degree of freedom DOF which optimizes the performance of the system at that station X, $EWT_{local, 1st \, round}$, by considering that the entire system remains static and only the examined entity, i.e. bus can be modified. For doing this for one bus B at one station X $N_f$ computations are required and for covering all entities B at all stations X, X−1, X+1, . . . the performance cost goes up to $N_f \cdot N_E \cdot N_S$.

Figure 5:
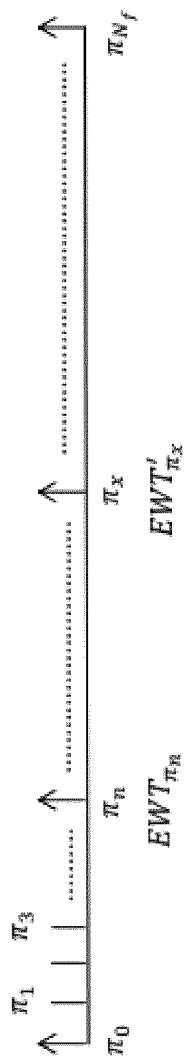
FIG. 5 shows a schematical view of degrees of freedom according to an embodiment of the present invention.

3. The available set of policies, i.e. DOF for one entity, i.e. bus B are $\{\pi_0, \pi_1, \ldots, \pi_n, \ldots, \pi_x, \ldots, \pi_{Nf}\}$, where $\pi_n$ is the do-nothing policy with a computed performance cost $EWT_{\pi n}$ and $\pi_x$ is the solution that minimized the performance cost if everything else in the system remains constant (do-nothing condition) with cost $EWT_{\pi x}$. After optimizing a number of preceding stations X−1, X−2, . . . , the effect of policy $\pi_x$ to the examined station X together with other policies that are implemented simultaneously to different entities returns a different performance cost to the spatio-temporal evolving system: $EWT'_{\pi x}$. FIG. 5 shows such a list of policy measures.

4. Introduce a stochastic annealing search which picks the next policy measure from the $N_f$ degrees of freedom DOF to ensure that solution space is efficiently searched even if the number of available selections is $N'_f \leq 3$. The efficiency of the search space is detailed further.

The following steps are preferably used to perform a stochastic annealing search:

a) $1^{st}$ Selection Step: $N'_f = 1$. Define probabilities of selecting the policy measure $\pi_k \in N_f$ based on the already computed performance of measures $\pi_n$ and $\pi_x$ and select the measure with the highest probability I. $P(\pi_k) = \dfrac{(EWT_{\pi_n}/EWT'_{\pi_x})\pi_k + W\|(\pi_k - \pi_n)(\pi_k - \pi_x)/N_f\|}{\sum\limits_{\pi_k \in N_f}[(EWT_{\pi_n}/EWT'_{\pi_x})\pi_k + W\|(\pi_x - \pi_n)(\pi_k - \pi_x)/N_f\|]}$ The term $W\|(\pi_k - \pi_n)(\pi_k - \pi_x)/N_f\|$ is higher when the measure $\pi_k$ is closer to the other policy measures for which the system's performance has been computed ($=\pi_n$ and $\pi_x$). W is a weight factor and when it is higher, it increases the probability of selecting measures closer to the computed ones for which information regarding their performance is obtained.

II. Choose $\pi_{k*}|P(\pi_{k*}) \geq P(\pi_k) \forall \pi_k \in N_f$
III. Compute $EWT \pi_{k*}$ b) $2^{nd}$ Selection Step: $N'_f = 2$. Re-define probabilities of selecting the policy measure $\pi_k \in N_f$ based on the already computed $EWT_{\pi n}$, $EWT_{\pi x}$ and $EWT_{\pi k*}$. When assuming that $\pi_n \leq \pi_{k*} \leq \pi_x$, then, if $\pi_k \leq \pi_{k*}$:

I. $P(\pi_k) = \dfrac{(EWT_{\pi_n}/EWT_{\pi_{k*}})\pi_k + W\|(\pi_k - \pi_n)(\pi_k - \pi_{k*})/N_f\|}{\sum\limits_{\pi_k \in N_f}[(EWT_{\pi_n}/EWT'_{\pi_x})\pi_k + W\|(\pi_x - \pi_n)(\pi_k - \pi_x)/N_f\|]}$ Else 1 1 $\pi_k \geq \pi_{k*}$:

I. $P(\pi_k) = \dfrac{(EWT_{\pi_{k*}}/EWT'_{\pi_x})\pi_k + W\|(\pi_k - \pi_{k*})(\pi_k - \pi_x)/N_f\|}{\sum\limits_{\pi_k \in N_f}[(EWT_{\pi_n}/EWT'_{\pi_x})\pi_k + W\|(\pi_k - \pi_n)(\pi_k - \pi_x)/N_f\|]}$ II. Choose $\pi_{k}|P(\pi_{k}) \geq P(\pi_k) \forall \pi_k \in N_f$
III. Compute $EWT \pi_{k**}$ c) $3^{rd}$ Selection Step: $N'_f = 3$. Re-define probabilities of selecting the policy measure $\pi_k \in N_f$ based on the already computed $EWT_{\pi n}$, $EWT_{\pi x}$, $EWT_{\pi k*}$ and $EWT_{\pi k**}$ and select the last measure as shown in the previous steps.

Figure 6:
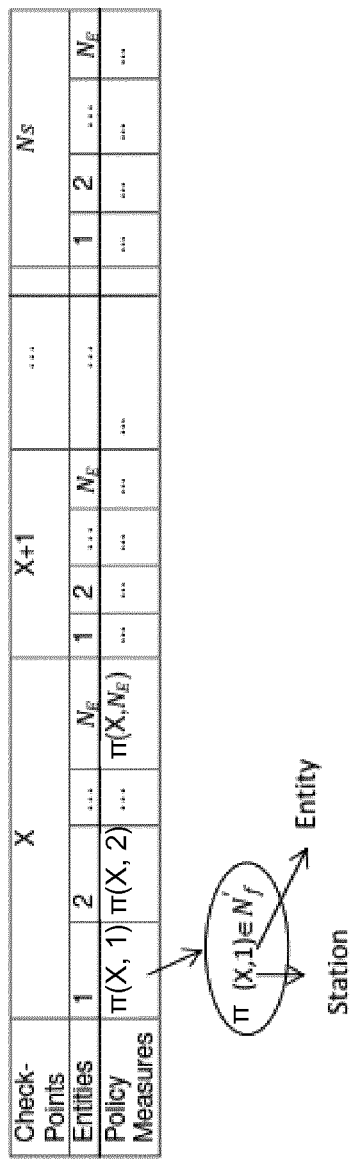
FIG. 6 shows a table of resulting performance cost for a system according to an embodiment of the present invention.

The outcome of the constrained solution search returns a first direction towards the global optimum, 'DTGO' with performance cost $EWT'_{global}$ and during the computation one policy measure (i.e., here dwell time increase/decrease) $\in N'_f$ is selected for each bus B at each bus station X as shown in FIG. 6.

In FIG. 6 check points refer to bus stops, entities are provided in form of busses and the policy measures are the values which are selected from the set of degree of freedom DOF.

Figure 7:
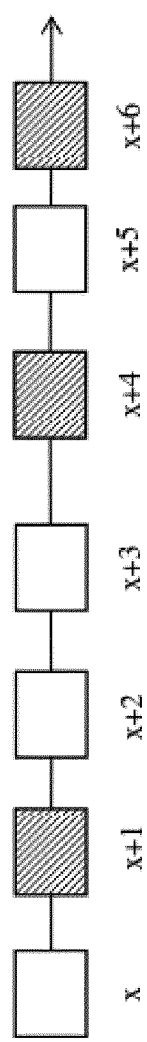
FIG. 7 shows a schematical view of identified NIS according to an embodiment of the present invention.

FIG. 7 shows a schematical view of degrees of freedom according to a fourth embodiment of the present invention. In FIG. 7 bad-performing stations are shown with $EWT_{stationID} > T$ are shown. After having found a "direction on the global optimum" DTGO with computational cost $\sim N'^{NE}_f * N_S$, where $N'_f \in \{2, 3\}$ and $N_f << N_f$ the optimization effect is being balanced among bus stations S via a second round of cost-efficient computations.

It may be assumed that the performance of the bus operations after the first round of computations is $EWT'_{global}$. In addition, the local performance at each station S was also calculated as $EWT_{stationID}$, where ID is the ID of the bus station S.

In this step, a threshold value T is set which should not be violated, i.e., the performance at each bus station S should be $EWT_{check-pointID} \leq T$. The bus stations S that after the first round of computations do not satisfy such constraints are considered as "bad-performing" stations and the analysis below focuses mainly on them.

Isolating each bad-performing station (i.e., "X+1") allows the search of a more optimal solution via increasing the degree of freedom DOF with a computational cost:

$N^{NE}_f * N_{S'}$ where $N_{S'}$ is the number of "bad-performing" bus stations NIS. However, the aforementioned computational cost is still not scalable; hence, a relaxation is proposed:

Assuming that $ETW_{global}$ is computed and the EWT at the stations S is $EWT_x$, $EWT_{x+1}$, ..., and $EWT_{x+1}$, $EWT_{x+4}$, $EWT_{x+6}$>T. To distribute the EWT violation among the stations S without penalizing the already computed "global direction" $EWT_{global}$, each bad-performing checkpoint is allowed to penalize the global EWT. The penalty, P, is:

$$p = \frac{|EWT_{global} - T|}{N_{S'}}$$

where $N_{S'}$ is the number of bad-performing stations NIS. When looking on a bad-performing station NIS in a first step, the degrees of freedom DOF are increased from $N_f'$ to $N_f$ to broaden the search space for finding a better solution.

In the proposed relaxation, the already computed solution for bus station "X+1" is considered as starting point. Then, all buses B are not optimized simultaneously, but sequentially. However, the sequential optimization can not search the entire solution space and numerous solutions are not examined. To increase the coverage of the solution space search the "up-down" sequential optimization approach is replaced with the introduction of a "stochastic branch-hopping" approach. For the sake of comparison, the number of required computations and the solution space coverage of the three methods are presented in the following table.

|  | Number of Computations | Solution Space Search |
|---|---|---|
| Brute-Force | $N_f^{NE}$ | $N_f^{NE}$ |
| Up-Down Sequential Optimization | $N_f * N_E$ | $N_f$ |
| Stochastic Branch Hopping | $N_f * N_E$ | $N_f + (N_f - 1)(N_E - 1)$ |

Figure 8:
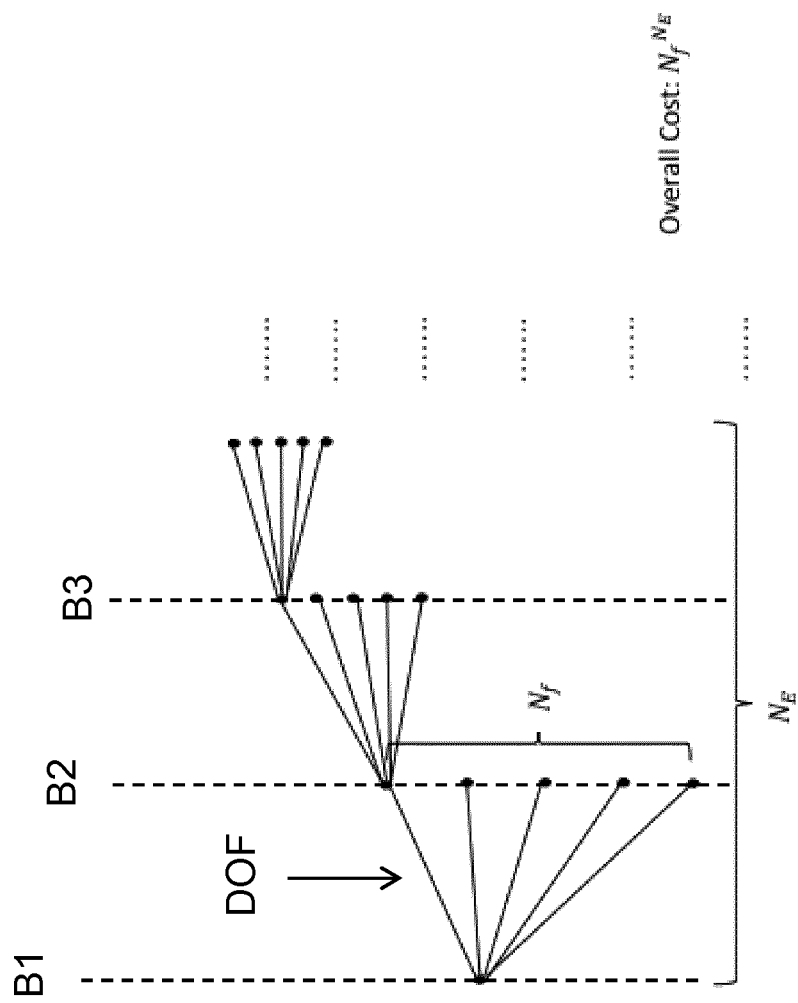
FIG. 8 shows a schematical view of a scenario for optimizing an NIS according to an embodiment of the present invention.

FIG. 8 shows a schematical view of a scenario for optimizing a NIS according to a seventh embodiment of the present invention. The number of options resulting in the possible overall cost of computations for the buses B1, B2, B3, ... is shown in FIG. 8.

Figure 9:
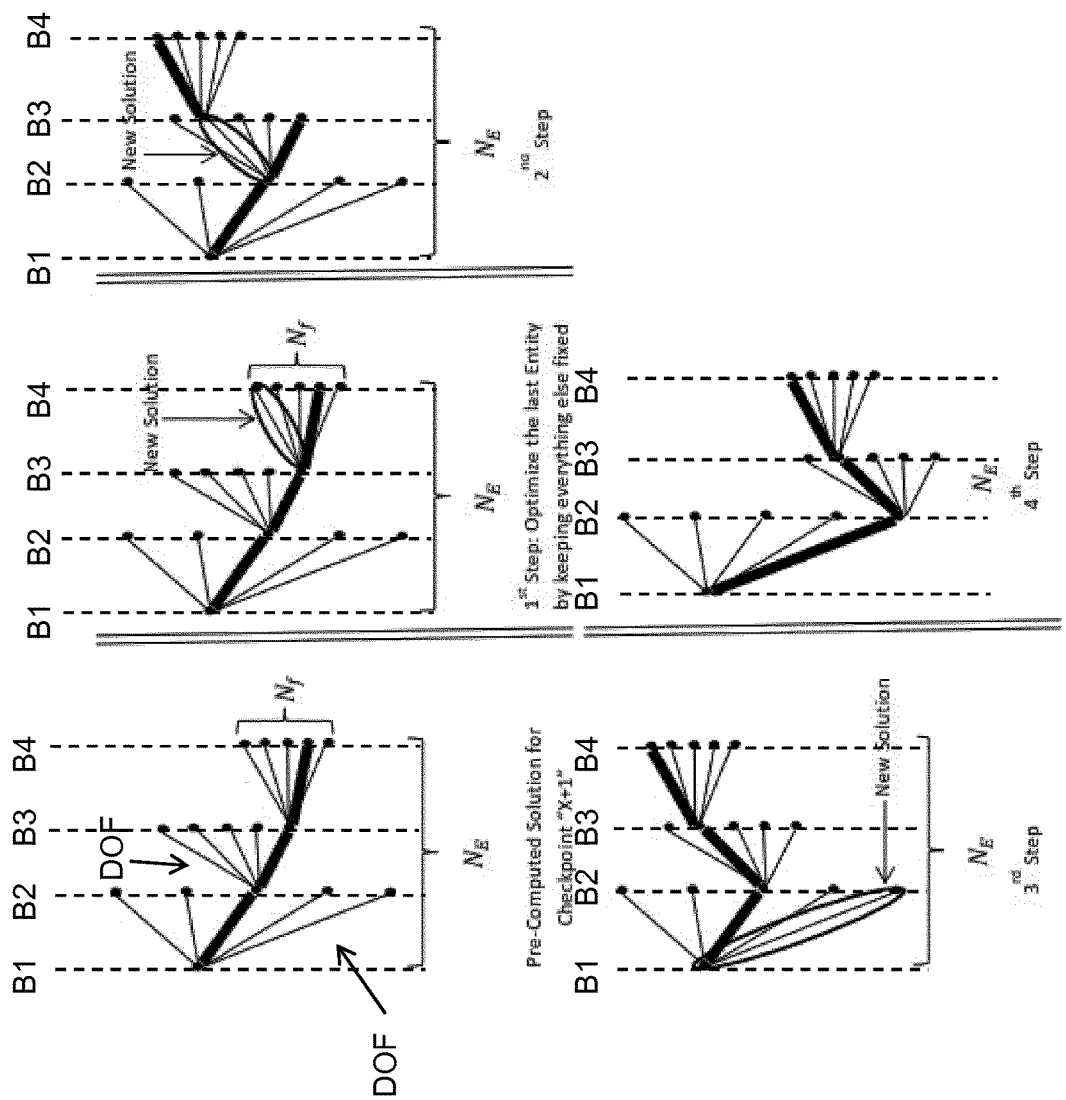
FIG. 9 shows a part of a method according to an embodiment of the present invention.

In FIG. 9 the branch hopping approach on optimizing locally station with index X+1 is shown: In FIG. 9 in an initial step the precomputed solution, i.e. the precomputed selection of DOF for each bus B1, B2, B3, B4 is shown depicted by the solid line as a graph through the busses B1, B2, B3, B4. In the first step the last entity B4, i.e. the last bus B4 is optimized by keeping everything else fixed. In the following steps the previous bus B3 with its degree of freedom is optimized.

To summarize FIG. 9: The branch hopping approach comprises the following steps:
1) At each step, the best policy measure of the set of DOF for one examined entity B4, B3, B2, B1 is selected based on the local ETW reduction—starting from the most distant bus B4 of the system (i.e., the latest arriving bus B4 at the examined station X+1).
2) Having computed the best solution for one bus B4, B3, B2, B1, the optimization focus shifts to the previous bus B3; B2, B1.
3) When the bus arrival time is optimized, all buses B1, B2, B3, B4 that have been optimized before remain stable and the whole branch shifts to another node (like being a concrete block).

Having completed the aforementioned search, a new solution, i.e. new arrival times have been computed with local performance: $EWT'_{x+1}<EWT_{x+1}$. However, this solution affects the global EWT now became $EWT'_{global}$ from $EWT_{global}$. The modified $EWT'_{global}$ is checked against the one computed via the "global-direction" DTGO search and if $EWT'_{global}-EWT_{global} \leq P$, then the computed solution is adopted and it is proceeded to the next bad-performing station NIS. Otherwise, the solution is recomputed by omitting the degree of freedom DOF, for example if $EWT'_{global}-EWT_{global}<P$ then the corresponding DOF is eliminated, that was selected for the optimization of the last bus at the branch hopping approach resulting to an entire re-computation of the station solution. Thus, the computational cost is reduced from $N_f^{NE} \cdot N_{S'}$ to $N_f \cdot N_E \cdot N_R \cdot N_{S'}$, where $N_R$ is the total number of re-computations.

The last part can be replaced with another approach or embodiment. In such approach or embodiment the $EWT_{global}$ is computed at each step together with the $EWT_{x+1}$ and if the proposed solution reduces both measures, it is adapted until a new one which overwhelms its performance is computed.

Figure 10:
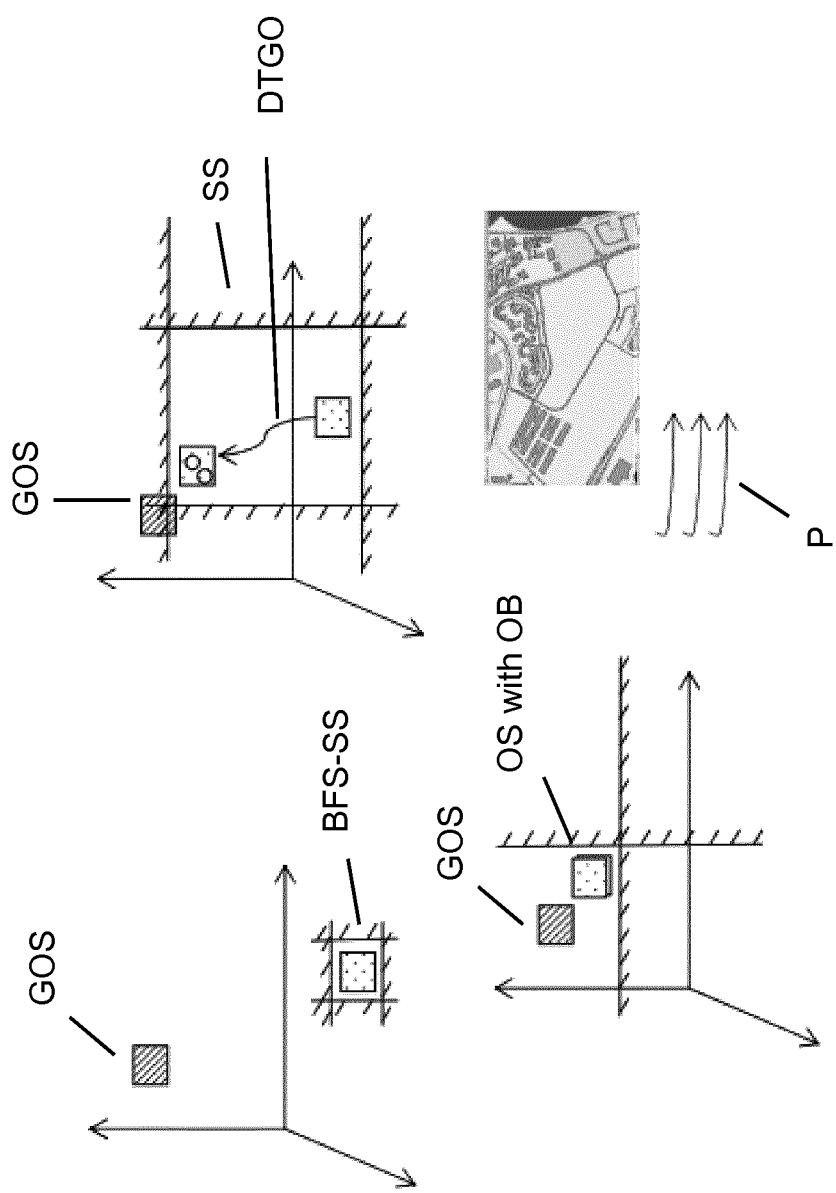
FIG. 10 shows principal steps of a method according to an embodiment of the present invention.

FIG. 10 shows principal steps of a method according to a ninth embodiment of the present invention. In FIG. 10 a schematic view of the performance of a bus optimization method is shown. In the upper left part the available search space SS for a Brute-Force search BFS within an acceptable computational time is shown and a global optimized solution GOS of the system. Next, the broadening of the solution space/search space SS with the use of the "direction-to-global-optimization" DTGO method is shown in the upper right part of FIG. 10, wherein within that SS an optimization solution OS is found with said DTGO. Finally, in the lower left part of FIG. 10 the bad performing stations are further optimized with the optimization balancing OB starting from the optimized solution OS while there is a small room for decreasing slightly the performance of the solution computed via the "direction-to-global-optimization" DTGO method.

In summary, embodiments of the present invention implement a bottom up branch hopping and merging technique to maximize the solution space within minimal computation time. Embodiments of the present invention further enable a two step headway optimization using a global optimization search and branch hopping to alleviate bad-performing stations. Even further, embodiments of the present invention provide a sequential stochastic annealing search method in global optimization for selecting more efficiently the measures, i.e. the DOF. Embodiments of present invention may provide, inter alia, the following advantages: computational reduction of the moving object operation problem to an affordable level, optimization balancing of the performance of moving objects among stations and no limits on the estimation methods for capturing the effect of an implementation policy measure, i.e. DOF, to the system which can be for example simple models, detail simulations, or the like.

According to an embodiment, the present invention provides a method for optimizing bus operations via balancing headway variation comprising:
1) Searching for a "direction towards the global optimum" via sequential optimizations from station to station instead of searching for the global optimum itself.
2) Reducing the set degrees of freedom via a "stochastic annealing method" and return a global optimization direction.
3) "Optimization balancing" which occurs after the computed "global-optimization direction" where "bad-performing" stations are isolated and optimized via a "branch hopping" that does not deteriorate the "global-optimization direction" solution.

Embodiments of the present invention can be used for offline optimization as well as online optimization. Then throughout the figures $EWT_{global}$ and EWT do nothing are time dependent and have to be recomputed, for example according to the needs of an operator or in predefined time intervals or the like.

Embodiments of the present invention address the problem of optimizing in particular bus or public transport scheduling by normalizing the headway variation among busses. It comprises in particular a stochastic search to provide a direction towards the global optimum for minimizing the headway variation at each isolated station in a sequential manner. In a further step by utilizing system properties a bottom up branch hopping and merging technique is applied providing a strategy to minimize the headway variation with minimal computation time.

Applications of the present invention include, for example, balancing bus headways among stations for optimizing the frequency of moving objects passing a set of stations during the route optimizing deliveries of logistic trucks via balancing the delivery penalties among customers managing the patrolling area coverage over time and space in case of patrolling vehicles and problems for focus on the visit of a pre-defined set of points over time and space while retaining a "closer-to-optimal" variation with the preceding and following entities, i.e., transport modes.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for optimizing configuration information for a system comprising a plurality of vehicles, each vehicle moving in time and passing one or more stations in succession, the method to be performed in memory available to one or more processors, the method comprising: assigning, for each vehicle, a first number of degrees of freedom (DOF); presetting one or more system parameters (SP) representing a performance of at least part of the system; successively optimizing each respective vehicle at each station by selecting a DOF for each vehicle from a second number of DOF for the respective vehicle, wherein the second number of DOF is smaller than the first number of DOF, and computing a global system parameters; assigning each vehicle of each station a DOF resulting from a first system configuration (SC); evaluating the global system parameters for the first SC; identifying one or more stations having a negative impact, (NIS) on the global system parameters on the first SC; and successively optimizing, for the one or more NIS, each vehicle locally at each respective NIS with regard to the SP with a number of DOF greater than said second number of DOF and such that the SP for the first SC does not deteriorate.

2. The method according to claim 1, wherein the second number of DOF is selected out of the first number of DOF by a stochastic annealing search.

3. The method according to claim 1, wherein for identifying the one or more NIS, the local SP of each station is computed and compared with a predefined threshold.

4. The method according to claim 1, wherein for successively optimizing, for the one or more NIS, each vehicle locally at each respective NIS comprises sequentially optimizing each vehicle locally at each respective NIS.

5. The method according to claim 4, wherein the sequentially optimizing each vehicle is performed in reverse arrival order of each vehicle at each NIS.

6. The method according to claim 4, wherein at each respective NIS the local SP for the respective NIS is evaluated and if the local SP evaluation provides a deteriorated global SP then for the respective NIS the selected DOF is eliminated from the set of DOF to be selected and D) is performed again for said NIS.

7. The method according to claim 1, wherein a local SP is evaluated together with a global SP at a respective NIS sequentially for each vehicle and if a successive evaluation performed for each vehicle reveals that the global SP and the local SP are enhanced then at the respective NIS the next vehicle is optimized by choosing a DOF until a vehicle is found further enhancing the local SP and the global SP.

8. The method according to claim 4, wherein for successively optimizing, for the one or more NIS, each vehicle locally at each respective NIS a penalty score is computed and evaluated representing a difference between the predefined threshold and the global SP divided by a number of the one or more NIS.

9. The method according to claim 2, wherein during the stochastic annealing search successively probabilities for selecting a DOF are redefined based on an already computed global SP based on preset data, of the global SP based on optimization on preset data without a DOF of each moving object and if applicable the prior computed probability for the DOF.

10. The method according to claim 9, further comprising obtaining a global optimized configuration, wherein the global optimized configuration is evaluated and provided in parts as operating information to each moving object correspondingly and/or to each station correspondingly.

11. A system for optimizing configuration information for a system comprising a plurality of vehicles, each vehicle moving in time and passing one or more stations in succession, wherein for each moving object a first number of degrees of freedom (DOF) are assigned and wherein one or more system parameters (SP) are preset representing a performance of at least part of the system comprising the plurality of vehicles, the system comprising: one or more processors configured to: successively optimize each respective vehicle at each station by selecting a DOF for each vehicle from a second number of DOF for the respective vehicle, wherein the second number of DOF is smaller than the first number of DOF, and computing a global system parameters; assign each vehicle of each station a DOF resulting from a first system configuration (SC); evaluate the global system parameters for the first SC; identify one or more stations having a negative impact, (NIS) on the global system parameters on the first SC; and successively optimize, for the one or more NIS, each vehicle locally at each respective NIS with regard to the SP with a number of DOF greater than said second number of DOF and such that the SP for the first SC does not deteriorate.

* * * * *